United States Patent
Iwata

(10) Patent No.: US 8,317,969 B2
(45) Date of Patent: *Nov. 27, 2012

(54) PLASMA PROCESSING APPARATUS

(75) Inventor: Manabu Iwata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 732 days.

This patent is subject to a terminal disclaimer.

(21) Appl. No.: 12/410,809

(22) Filed: Mar. 25, 2009

(65) Prior Publication Data

US 2009/0242134 A1 Oct. 1, 2009

Related U.S. Application Data

(60) Provisional application No. 61/092,599, filed on Aug. 28, 2008.

(30) Foreign Application Priority Data

Mar. 25, 2008 (JP) .................. 2008-077402

(51) Int. Cl.
- *C23F 1/00* (2006.01)
- *H01L 21/306* (2006.01)
- *C23C 16/00* (2006.01)

(52) U.S. Cl. ............... 156/345.44; 118/723 E
(58) Field of Classification Search ........ 156/345.43–345.47; 118/715, 118/722, 723 R, 723 E; 315/111.21
See application file for complete search history.

(56) References Cited

U.S. PATENT DOCUMENTS

| | | | |
|---|---|---|---|
| 7,967,930 B2 * | 6/2011 | Lewington et al. | 156/51 |
| 2005/0031796 A1 * | 2/2005 | Wu et al. | 427/569 |
| 2005/0276928 A1 | 12/2005 | Okumura et al. | |

FOREIGN PATENT DOCUMENTS

JP 2004-363552 12/2004

* cited by examiner

*Primary Examiner* — Maureen Gramaglia
(74) *Attorney, Agent, or Firm* — Oblon, Spivak, McClelland, Maier & Neustadt, L.L.P.

(57) ABSTRACT

A plasma processing apparatus includes a processing chamber; a lower center electrode mounting thereon a target substrate; a lower peripheral electrode; an upper electrode disposed above the lower center electrode; a gas supplying unit supplying a processing gas into the processing chamber; a first RF power supply outputting a first RF power for generating a plasma of the processing gas; a second RF power supply for outputting a second RF power for introducing ions into the substrate; and a central feed conductor connected to a rear surface of the lower center electrode. The apparatus further includes a circumferential feed conductor connected to a rear surface of the lower peripheral electrode to bypass and supply some of the first RF power to the lower peripheral electrode; and a movable feed conductor electrically connecting the central feed conductor and the circumferential feed conductor for the first RF power by capacitance coupling.

14 Claims, 8 Drawing Sheets

PLASMA PROCESSING APPARATUS

FIELD OF THE INVENTION

The present invention relates to a technique for performing plasma processing on a substrate to be processed; and, more particularly, to a capacitively coupled plasma processing apparatus having parallel plate electrodes.

BACKGROUND OF THE INVENTION

In a manufacturing process of a semiconductor device or an FPD (flat panel display), a plasma is often used in processes, e.g., etching, deposition, oxidation, sputtering and the like, in order to make a processing gas react efficiently at a relatively low temperature. Conventionally, a capacitively coupled plasma processing apparatus capable of generating a plasma of a large diameter is mainly used for a single-wafer plasma processing apparatus.

Generally, in the capacitively coupled plasma processing apparatus, an upper and a lower electrode are disposed in parallel with each other in an evacuative processing chamber, and a substrate to be processed (e.g., a semiconductor wafer, a glass substrate or the like) is mounted on the lower electrode. By applying a high frequency power (an RF power) to both electrodes, electrons accelerated by a high frequency electric field formed between the electrodes, secondary electrons emitted from the electrodes, or heated electrons collide with molecules of a processing gas to generate ions. Accordingly, a plasma of the processing gas is generated, and a required microprocessing, e.g., etching, is performed on a substrate surface by radicals or ions in the plasma.

In the etching process, there is widely used a lower dual frequency application mode in which a first RF power preferably having a relatively high frequency (generally greater than or equal to about 40 MHz) for plasma generation (RF discharge) and a second RF power preferably having a relatively low frequency (generally lower than or equal to about 13.56 MHz) for ion attraction to the substrate (bias) are simultaneously applied to a lower electrode.

Meanwhile, with increasing demands for miniaturization and high integration of devices in the semiconductor processing technique, a high efficiency, high density and low bias plasma processing is required in the capacitively coupled plasma processing apparatus. To do so, the high frequency power for plasma generation tends to be set as high as possible. Meanwhile, along with the tendency to increase the chip size and the diameter of the substrate, the plasma is required to be of a larger diameter and, therefore, a chamber (processing vessel) is scaled up accordingly.

Here, the problem is that it is difficult to get uniform plasma density within the processing space (especially in a radial direction) of the chamber. That is, if RF frequency for discharge increases, standing wave is formed within the chamber (the wave effect) or more RF waves are concentrated around the central part of the surface of an electrode (the skin effect). Roughly speaking, therefore, the density of plasma becomes non-uniform in the form of the profile with the maximum at the central part on the substrate and with the minimum at the edge part. If plasma density is not uniform on the substrate, the plasma processing may not be uniform and the manufacturing yield of devices goes down.

To that end, various electrode structures have been developed. For example, in a plasma processing apparatus described in Japanese Patent Laid-open Application No. 2004-363552 and corresponding US Patent Application Publication No. 2005-0276928, uniformity in a plasma density distribution is improved by inserting a dielectric member in a main surface of an electrode facing a processing space so that an impedance to a high frequency power emitted from the main surface of the electrode to the processing space increases at a central portion of the electrode and decreases at an edge portion of the electrode.

The technique for inserting a dielectric member in a main surface of an electrode is disadvantageous in that the impedance distribution on the main surface of the electrode is fixed by a profile and a material of the dielectric member. Accordingly, a process region where the uniformity of the plasma density distribution can be controlled is small. Further, it is not possible to flexibly cope with various processes or changes of processing conditions.

Further, there is a plasma etching apparatus employing the lower electrode dual frequency application system in which the first RF power for plasma generation (discharge) and the second RF power for ion introduction are simultaneously or overlappingly applied to a lower electrode. In the apparatus, when the lower electrode has a structure in which the dielectric is embedded to make impedance of an electrode central portion relatively higher than that of an electrode edge portion, as described above, uniformity of an electric field intensity distribution on the main surface (top side) of the lower electrode is improved for the first RF power having a relatively high frequency, while the uniformity is deteriorated for the second RF power having a relatively low frequency because the electric field intensity becomes lower in the electrode central portion than the electrode edge portion. Therefore, there is a trade-off problem, i.e., improvement of plasma density uniformity resulting in deterioration of anisotropic etching uniformity.

In view of the above, the present invention provides a capacitively coupled plasma processing apparatus capable of easily or arbitrarily controlling the plasma density distribution, and improving uniformity of the plasma processing and/or the manufacturing yield.

SUMMARY OF THE INVENTION

In accordance with an aspect of the present invention, there is provided a plasma processing apparatus including: a vacuum-evacuable processing chamber; a lower center electrode mounting there on a substrate to be processed in the processing chamber; an annular lower peripheral electrode electrically isolated from the lower center electrode and surrounding the circumference of the lower center electrode; an upper electrode disposed above the lower center electrode and the lower peripheral electrode to be faced therewith; a process gas supplying unit for supplying a processing gas to a process space formed between the lower center electrode, the lower peripheral electrode and the upper electrode; a first radio frequency (RF) power supply for outputting a first RF power to mainly generate a plasma of the processing gas; and a second radio frequency (RF) power supply for outputting a second RF power to mainly introduce ions in the plasma into the substrate.

The apparatus further includes a central feed conductor connected to a rear surface of the lower center electrode to supply the first RF power from the first RF power supply and the second RF power from the second RF power supply to the lower center electrode; a circumferential feed conductor connected to a rear surface of the lower peripheral electrode to bypass and supply some of the first RF power from the first RF power supply to the lower peripheral electrode; and a movable feed conductor which is movable within a specific range and electrically connects the central feed conductor and the circumferential feed conductor with respect to the first RF power supplied from the first RF power supply by capacitance coupling.

With the above configuration of apparatus, a portion of the first RF power transmitted from the first RF power supply along the central feed conductor can be supplied to the lower peripheral electrode via the movable feed conductor, and the remaining RF power can be supplied to the lower center electrode via the central feed conductor. For example, by varying or adjusting a position of the movable feed conductor, it is possible to adjust capacitance or impedance of capacitance coupling between the movable feed conductor, the central feed conductor and/or the circumferential feed conductor and control a percentage of first RF supply power for the lower center electrode and that of the lower peripheral electrode or ratio therebetween, thereby easily and arbitrarily controlling a characteristic of a plasma density distribution on the lower electrode in a radial direction.

On the other hand, since a second RF power from the second RF power supply has a frequency lower than that of the first RF power, large capacitive impedance is applied although the coupling capacitance in the vicinity of the movable feed conductor is not different from that for the first RF power. By properly selecting impedance of the coupling capacitance, the second RF power can be little or partially supplied to the lower peripheral electrode.

The movable feed conductor is preferably movable up to a position at which the central feed conductor is electrically isolated from the circumferential feed conductor. In this case, it is possible to supply both of the first and second RF powers from the first and second RF power supplies to only the lower center electrode, and compatibility on hardware with conventional standard apparatuses having a single lower electrode can be attained.

The central feed conductor may have a cylindrical or columnar shape, and the movable feed conductor includes an annular central cylindrical portion surrounding the circumference of the central feed conductor, and a central radial portion extending outwardly radially from the central cylindrical portion to a position at which the central radial portion may be electrically connected to the circumferential feed conductor by capacitance coupling.

In this case, it is possible to move the movable feed conductor in an axial direction along the central feed conductor and also rotate the movable feed conductor around the central feed conductor as a rotation center axis. It is preferable to form a certain gap between the outer circumference of the central feed conductor and the inner circumference of the central cylindrical portion of the movable feed conductor and it is also preferable to block the gap with a dielectric (for example, by forming an insulating film on the outer circumference of the central feed conductor).

The circumferential feed conductor may include a circumferential cylindrical portion extending downward from the lower peripheral electrode, and a circumferential radial portion extending inwardly radially from the circumferential cylindrical portion to a position at which the circumferential radial portion is electrically connected to the movable feed conductor by capacitance coupling.

With this configuration, it is possible to obtain large coupling capacitance between the circumferential radial portion of the circumferential conductor and the movable feed conductor (particularly the central radial portion).

A focus ring is preferably mounted on the lower center electrode and the lower peripheral electrode. Further, it is possible to employ a configuration in which the diameter of the lower peripheral electrode is increased so that the circumference of the lower center electrode projects out of the substrate and the focus ring is loaded on the lower center electrode and the lower peripheral electrode.

In accordance with another aspect of the present invention, there is provided a plasma processing apparatus for generating a plasma of a processing gas by radio frequency (RF) discharge in a vacuum-evacuable processing chamber, and subjecting a substrate disposed at a predetermined position in the processing vessel to a desired plasma process under the plasma.

The apparatus includes: a center electrode and a circumferential electrode formed by radially dividing an RF electrode to which an RF power for discharge is applied from an RF power supply; a central feed conductor and a circumferential conductor connected to rear surfaces of the center electrode and the circumferential electrode, respectively, in order to distribute the RF power applied from the RF power supply to the center electrode and the circumferential electrode at a specific ratio; and a movable feed conductor which is movable within a specific range and electrically connects the central feed conductor and the circumferential feed conductor with respect to the RF power from the RF power supply by capacitance coupling.

With this configuration of apparatus, a portion of the RF power transmitted from the RF power supply along the central feed conductor can be supplied to the circumferential electrode by bypassing that RF power to the movable feed conductor, and the remaining RF power can be supplied to the center electrode via the central feed conductor. By varying or adjusting a position of the movable feed conductor, it is possible to vary or adjust capacitance or impedance of coupling capacitance in the RF power bypass path and control a percentage of RF supply power for the center electrode and that for the circumferential electrode and ratio therebewteen, thereby easily and arbitrarily controlling a characteristic of a plasma density distribution on the lower electrode in a radial direction.

In addition, it is easy to electrically isolate the central feed conductor from the circumferential feed conductor depending on a position of the movable feed conductor, thereby attaining compatibility on hardware with conventional standard apparatuses having a single RF electrode.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

Figure 1:
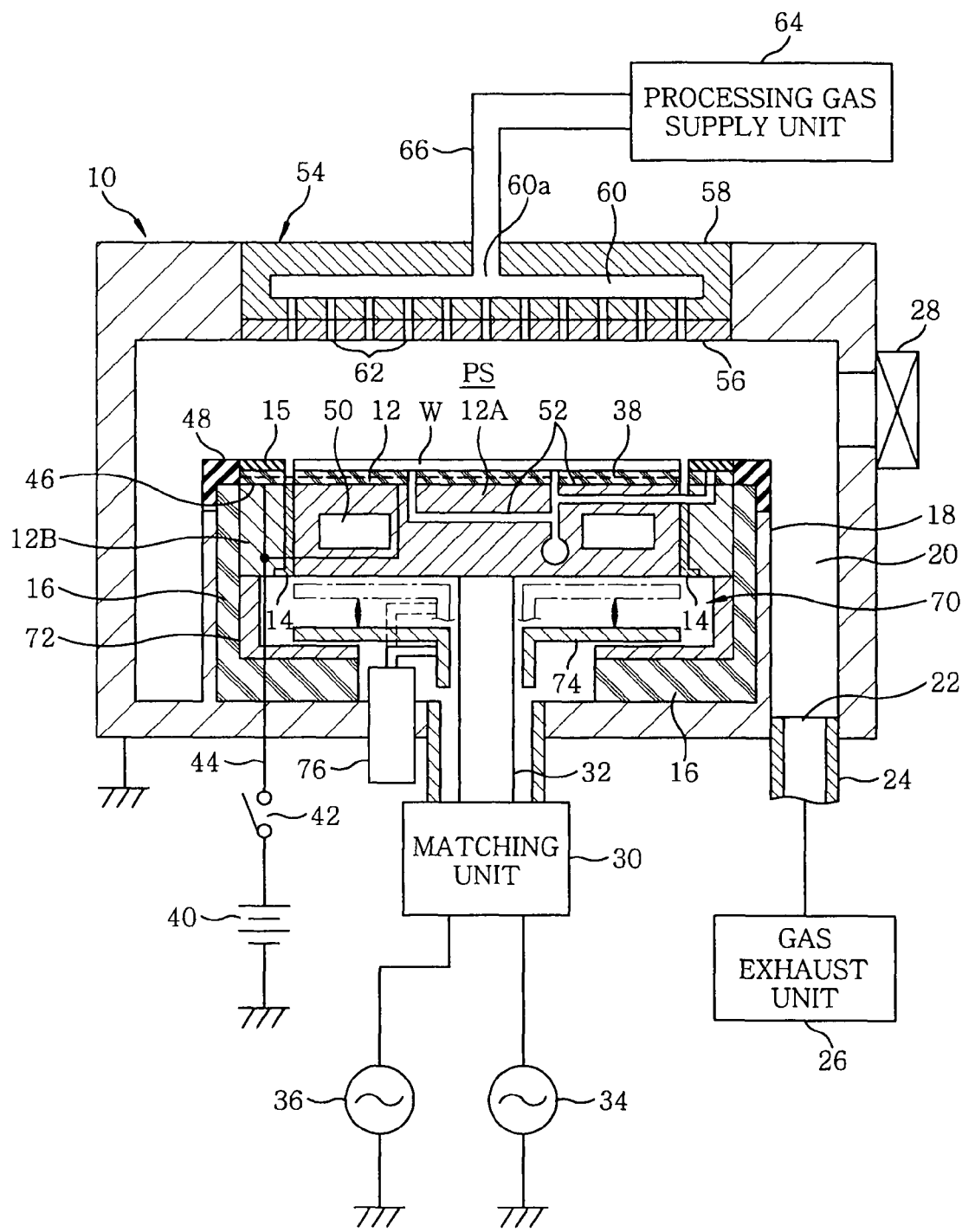
FIG. 1 is a longitudinal sectional view showing a configuration of a plasma etching apparatus in accordance with an embodiment of the present invention.

FIG. 1 shows a configuration of a plasma etching apparatus in accordance with an embodiment of the present invention. The plasma processing apparatus shown in the drawing is a capacitively-coupled plasma etching apparatus of a lower electrode dual frequency application type, and includes a cylindrical chamber (processing vessel) 10 made of metal such as aluminum, stainless steel or the like. The chamber 10 is frame grounded.

In the chamber 10, a susceptor (a lower electrode) 12 on which a substrate to be processed such as a semiconductor wafer W is mounted is horizontally arranged as an RF electrode. The susceptor 12 is divided into two parts, that is, a disc-shaped susceptor center electrode (lower center electrode) 12A and an annular susceptor peripheral electrode (lower peripheral electrode) 12B radially surrounding the circumference of the susceptor center electrode 12A.

The susceptor center electrode 12A has an aperture (diameter) larger than that of a semiconductor wafer W to be processed, and the semiconductor wafer W is mounted on the susceptor center electrode 12A. Further, a focus ring 15 having an inner diameter slightly larger than the diameter of the semiconductor wafer W is detachably attached on the susceptor peripheral electrode 12B. The electrodes 12A and 12B are made of, e.g., aluminum and are integrally combined together, with an annular insulator 14 interposed therebetween, and they are supported by an insulating cylindrical support 16 made of, e.g., ceramic, which extends vertically upward from the bottom of the chamber 10, without being grounded. The focus ring 15 is made of a material such as Si, SiC, C, $SiO_2$ or the like depending on a material to be etched of the semiconductor wafer W and may have a typical annular shape.

An annular gas exhaust path 20 is formed between the inner wall of the chamber 10 and a conductive cylindrical support 18 vertically extending from the bottom of the chamber 10 along an outer periphery of the insulating cylindrical support 16, and a gas exhaust port 22 is provided on the bottom. A gas exhaust unit 26 is connected to the gas exhaust port 22 via a gas exhaust line 24. The gas exhaust unit 26 has a vacuum pump such as a turbo molecular pump or the like, so that a processing space in the chamber 10 can be depressurized to a desired vacuum level. Provided on an outer side of sidewall of the chamber 10 is a gate valve 28 for opening and closing a loading/unloading port of the semiconductor wafer W.

The upper end of a columnar or cylindrical central power feed rod 32, which extends vertically upward from an output terminal of a matching unit 30 arranged under the chamber 10, is connected to a central portion of a rear surface (bottom surface) of the susceptor center electrode 12A. First and second RF power supplies 34 and 36 used for a lower electrode dual frequency application system are electrically connected to the susceptor center electrode 12A via the matching unit 30 and the central power feed rod 32. The central power feed rod 32 is made of a conductive material such as copper, aluminum or the like.

The first RF power supply 34 outputs a first RF power of a relatively high frequency, e.g., 60 MHz for generating a plasma on the susceptor center electrode 12A and the susceptor peripheral electrode 12B. On the other hand, the second RF power supply 36 outputs a second RF power of a relatively low frequency, e.g., 2 MHz for introducing ions into the semiconductor wafer W mounted on the susceptor center electrode 12A. The matching unit 30 includes a first matching device for matching between impedance of a first RF power supply 34 side and that of a load (mainly, electrode, plasma, chamber or the like) side and a second matching device for matching between impedance of a second RF power supply 36 side and that of the load side.

A center electrostatic chuck 38 for adsorbing the semiconductor wafer W with the electrostatic adsorptive force is provided on the susceptor center electrode 12A. The electrostatic chuck 38 is formed by embedding a sheet-shaped or a mesh-shaped conductor in a film-shaped or a plate-shaped dielectric, and is integrally formed with or integrally attached to the top surface of the susceptor center electrode 12A. Further, a DC power supply 40 provided outside the chamber 10 is electrically connected to the conductor via a switch 42 and a feeder line (e.g., wire) 44. Therefore, the semiconductor wafer W can be attracted and held on the electrostatic chuck 38 by a Coulomb force generated by DC voltage applied from the DC power supply 40.

Further, a peripheral electrostatic chuck 46 for adsorbing the focus ring 15 with an electrostatic absorptive force is provided on the susceptor peripheral electrode 12B. The peripheral electrostatic chuck 46 is also formed by embedding a sheet-shaped or a mesh-shaped conductor in a film-shaped or a plate-shaped dielectric, the conductor being electrically connected to the DC power supply 40. The focus ring 15 is adsorbed and held on the susceptor peripheral electrode 12B by a Coulomb force generated by applying a DC voltage from the DC power supply 40 to the conductor in the peripheral electrostatic chuck 46. In addition, an annular insulating cover ring 48 made of, e.g., quartz covers top surfaces of the cylindrical supports 16 and 18 to cover a circumference of the focus ring 15.

An annular coolant reservoir 50 extending in, e.g., a circumferential direction, is provided inside the susceptor central electrode 12A. A coolant, e.g., cooling water, of a predetermined temperature is supplied to be circulated therethrough from a chiller unit (not shown) outside the chamber 10 to the coolant reservoir 50 via a line (not shown). The processing temperature of the semiconductor wafer W on the center electrostatic chuck 38 can be controlled by the temperature of the coolant. In addition, a thermally conductive gas, e.g., He gas, is supplied from a thermally conductive gas supply unit (not shown) provided outside the chamber 10 to a space formed between top surfaces of the center electrostatic chuck 38 and the peripheral electrostatic chuck 48 and rear surfaces of the semiconductor wafer W and the focus ring 15 via a gas supply line (not shown) and a gas channel 52 formed in the susceptor center electrode 12A and the susceptor peripheral electrode 12B.

An upper electrode 54 of a ground potential, which serves as a shower head facing the susceptor central electrode 12A and susceptor peripheral electrode 12B in parallel, is installed at the ceiling of the chamber 10. The upper electrode 54 has an electrode plate 56 facing the susceptor 12 and an electrode support 58 for detachably supporting the electrode plate 56 from a rear surface thereof. The electrode support 58 has therein a gas chamber 60, and a plurality of gas discharge openings 62 extending from the gas chamber 60 toward the susceptor 12 is formed in the electrode support 58 and the electrode plate 56. A space between the electrode plate 56 and the susceptor central electrode 12A and susceptor peripheral electrode 12B becomes a plasma generation space or a processing space PS. A gas supply line 66 from the processing gas supply unit 64 is connected to a gas inlet port 60a provided at a top portion of the gas chamber 60. Further, the electrode plate 56 is made of, e.g., Si or SiC, and the electrode support 58 is made of, e.g., alumite processed aluminum.

Main features of the present plasma etching apparatus are that the susceptor 12 is divided into two, i.e., the susceptor central electrode 12A and the susceptor peripheral electrode 12B, in the radial direction and the apparatus has a lower electrode dual frequency feed mechanism 70 for supplying the first RF power (60 MHz) from the first RF power supply 34 to the susceptor center electrode 12A and the susceptor peripheral electrode 12B at a desired ratio and supplying the second RF power (2 MHz) from the second RF power supply 36 to only the susceptor center electrode 12A.

As shown in enlarged FIGS. 2 and 4, the lower electrode dual frequency feed mechanism 70 includes the above-mentioned central power feed rod 32 connected to the rear surface of the susceptor center electrode 12A, a lower peripheral power feed conductor 72 connected to the rear surface of the susceptor peripheral electrode 12B, a movable power feed conductor 74 that is vertically movable within a space formed below the susceptor center electrode 12A and electrically connects the lower peripheral power feed conductor 72 to the central power feed rod 32 by capacitance coupling with respect to the first RF power supplied from the first RF power supply 34, and an actuator 76 for supporting and elevating the movable power feed conductor 74.

The lower peripheral power feed conductor 72 is made of, e.g., copper or aluminum and has a cylindrical portion 72a extending vertically downward from the susceptor peripheral electrode 12B and a circumferential radial portion 72b horizontally and inwardly extending radially from the lower end portion of the cylindrical portion 72a. A dielectric material film 78 having a certain thickness d is attached to a top surface of the circumferential radial portion 72b.

The movable power feed conductor 74 is made of, e.g., copper or aluminum and has an annular central cylindrical portion 74a surrounding the circumference of the central power feed rod 32 and a central radial portion 74b horizontally outwardly extending in a radial direction from the central cylindrical portion 74a. A dielectric material film 80 having a certain thickness e is attached to the circumference of the central power feed rod 32, and the central cylindrical portion 74a of the movable power feed conductor 74 is vertically movable while rubbing a surface (circumference) of the dielectric material film 80, i.e., while keeping the gap e with the circumference of the central power feed rod 32. In addition, a dielectric material film 82 having a certain thickness f is also attached to the bottom surface of the susceptor center electrode 12A positioned above the central radial portion 74b.

The actuator 76 includes, e.g., an electric motor for generating a rotational driving force and a motion conversion mechanism for converting a rotational driving force of the electric motor into a linear driving force and a linear moving unit of the motion conversion mechanism is coupled to the central cylindrical portion 74a of the movable power feed conductor 74 via a bar-shaped supporting member 84.

The movable power feed conductor 74 is accommodated in a space between the susceptor center electrode 12A and the circumferential radial portion 72b of the lower peripheral power feed conductor 72 to be movable in a vertical direction and a rotational (θ) direction. The position of the movable power feed conductor 74 in the vertical direction is switched between a first position at which the central radial portion 74b is put on the circumferential radial portion 72b of the lower peripheral power feed conductor 72 via the dielectric material film 78, as shown in FIG. 2, and a second position at which the central radial portion 74b is put on the rear surface of the susceptor center electrode 12A via the dielectric material film 82, as shown in FIG. 4, by elevation driving by the actuator 76.

Figure 2:
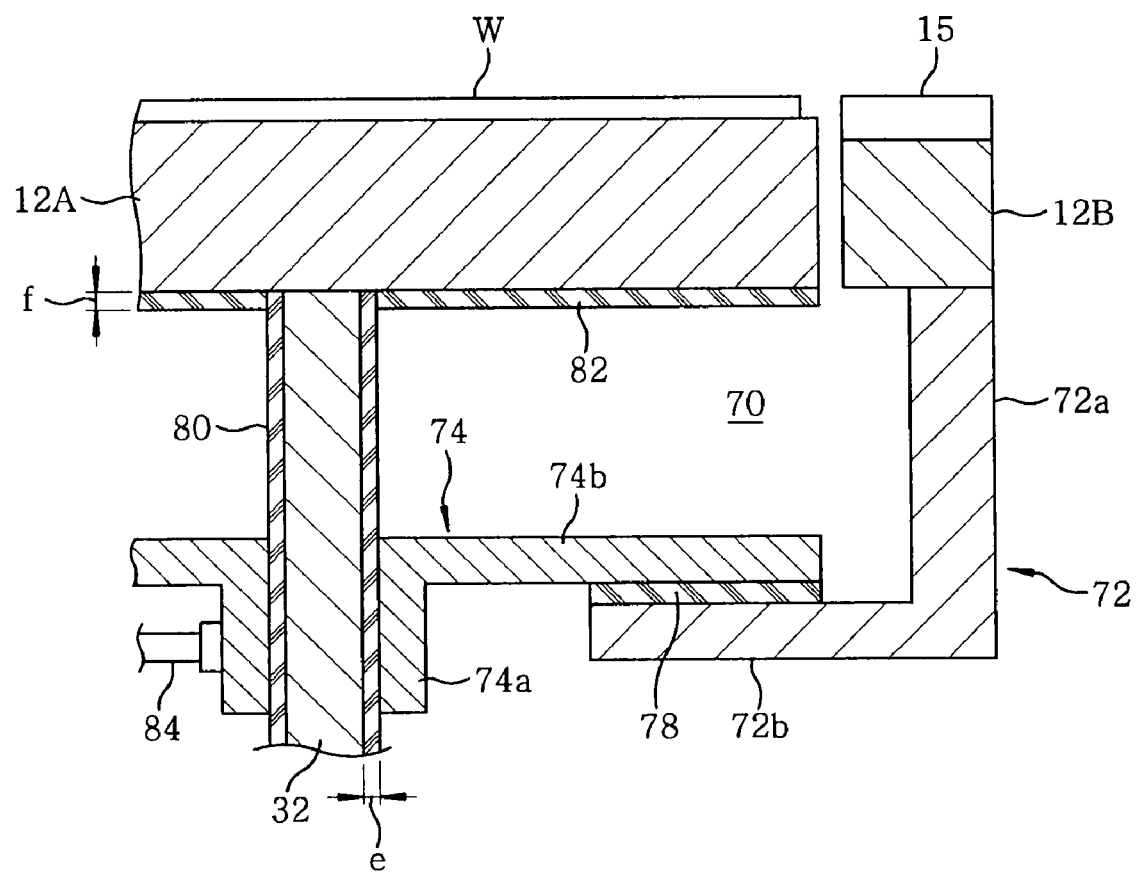
FIG. 2 is a partially-enlarged sectional view showing a configuration of a main part when a movable feed conductor is switched to a first position in the plasma etching apparatus in accordance with the embodiment.
Figure 3:
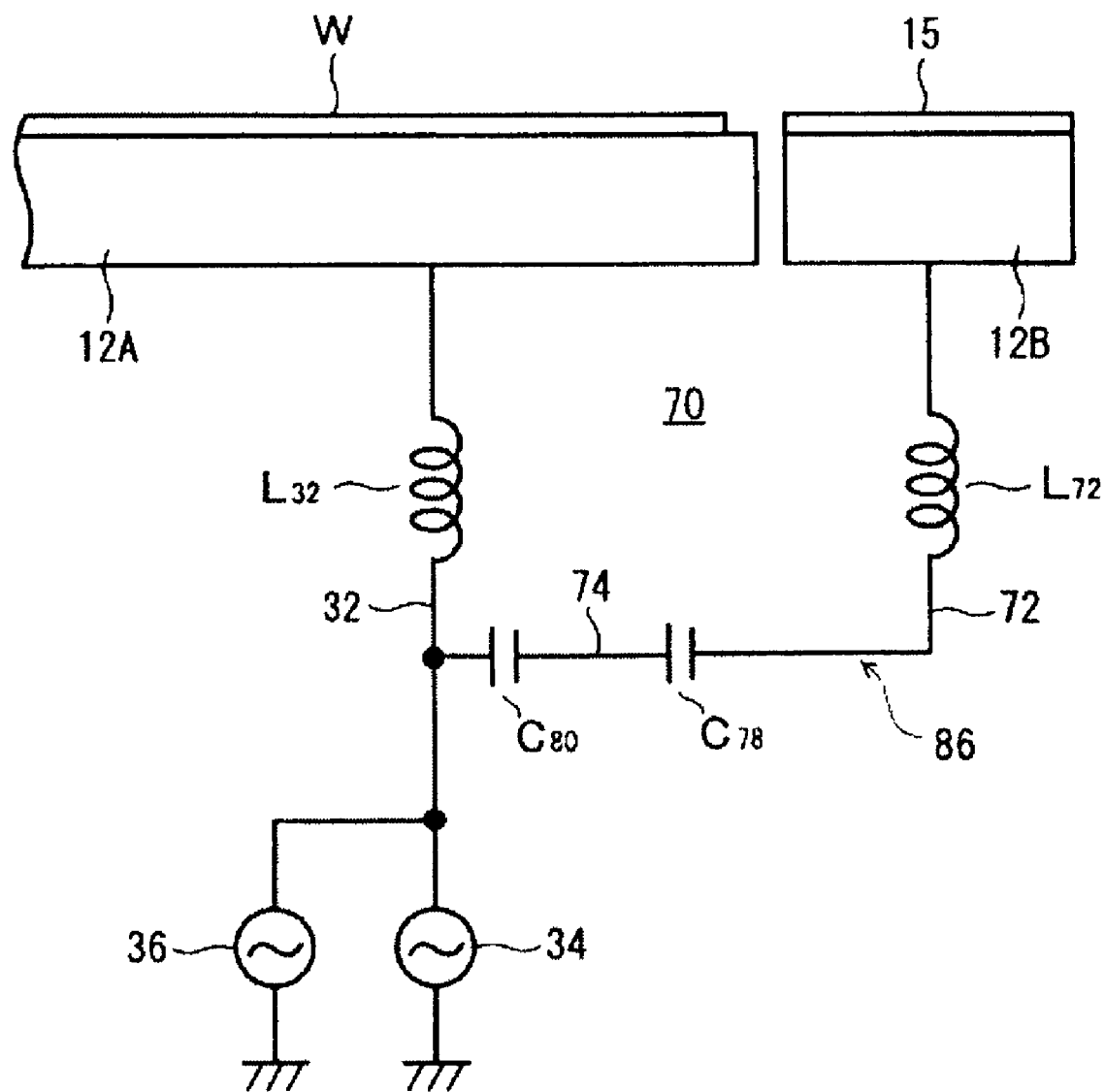
FIG. 3 is a schematic equivalent circuit diagram of a lower electrode dual frequency feed mechanism when the movable feed conductor is switched to the first position (FIG. 2)

FIG. 3 is a schematic equivalent circuit diagram of the lower electrode dual frequency feed mechanism 70 when the movable power feed conductor 74 is switched to the first position (FIG. 2).

In this case, while a capacitor C80 is formed with the central power feed rod 32, the central cylindrical portion 74a of the movable feed conductor 74, and the dielectric material film 80 interposed therebetween, a capacitor C78 is formed with the central radial portion 74b of the movable feed conductor 74, the circumferential radial portion 72b of the lower peripheral power feed conductor 72, and the dielectric material film 78 interposed therebetween. Accordingly, an RF bypass path 86 which electrically interconnects the central power feed rod 32 and the lower peripheral power feed conductor 72 by capacitance coupling of the capacitors C80 and C78 is formed with respect to the first RF power (60 MHz) supplied from the first RF power supply 34. In other words, the mechanism enters a mode (first mode) where not all of the first RF power from the first RF power supply 34 is supplied to the susceptor center electrode 12A via the central power feed rod 32, but a part of the RF power is branched from the central power feed rod 32 to the RF bypass path 86 to be supplied to the susceptor peripheral electrode 12B.

By properly choosing or adjusting capacitance of both capacitors C80 and C78, inductance L32 of a vicinity of the top surface of the central power feed rod 32, inductance L72 of the lower peripheral power feed conductor 72, inductance (not shown) of the movable feed conductor 74 or the like, it is possible to arbitrarily control a ratio between an amount of power supplied to the electrode 12A and that supplied to the electrode 12B, divided electrodes of the susceptor 12, from the first RF power supply. Typically, the amount of power supplied to the central susceptor electrode 12A greatly exceeds that supplied to the susceptor peripheral electrode 12B. However, since the susceptor peripheral electrode 12B has higher power supply efficiency per unit area in inverse proportion to an electrode area ratio, it is possible to control the first RF power per unit area emitted from divided electrodes 12A and 12B to the process space PS at a desired ratio or uniformity.

Further, in the second RF power (2 MHz) supplied from the second RF power supply 36, the capacitance of capacitors C80 and C78 is not different from that in the first RF power. However, since the second RF power has a lower frequency (2 MHz/60 MHz=1/30 time)) than that of the first RF power and has a higher capacitive impedance (30 times) than that of the first RF power in inverse proportion to the frequency difference, the RF bypass path 86 may be made not to be a bypass as substantial as to distribute the second RF power to the susceptor peripheral electrode 12B at a meaningful ratio. However, it is possible to set the capacitance of capacitors C80 and C78 to distribute the second RF power as well as the first RF power to the susceptor center electrode 12A and the susceptor peripheral electrode 12B.

Figure 4:
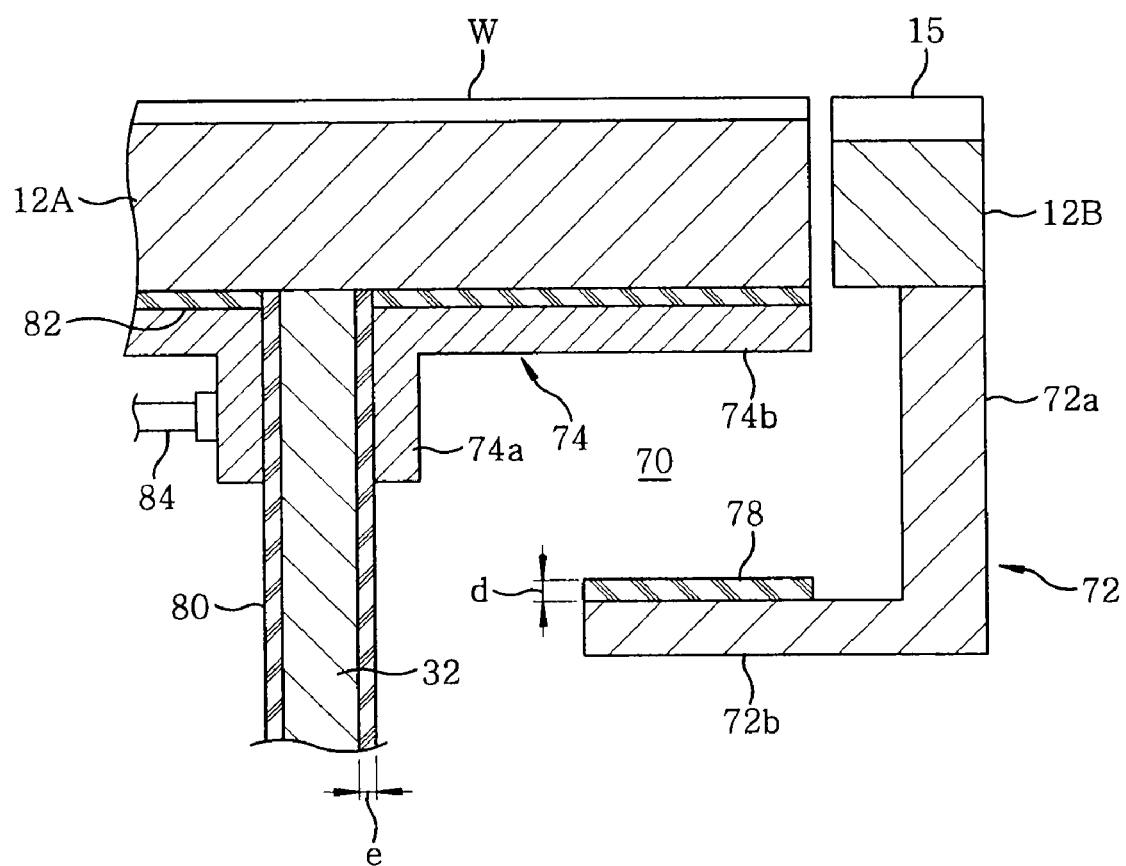
FIG. 4 is a partially-enlarged sectional view showing a configuration of a main part when the movable feed conductor is switched to a second position in the plasma etching apparatus in accordance with the embodiment.
Figure 5:
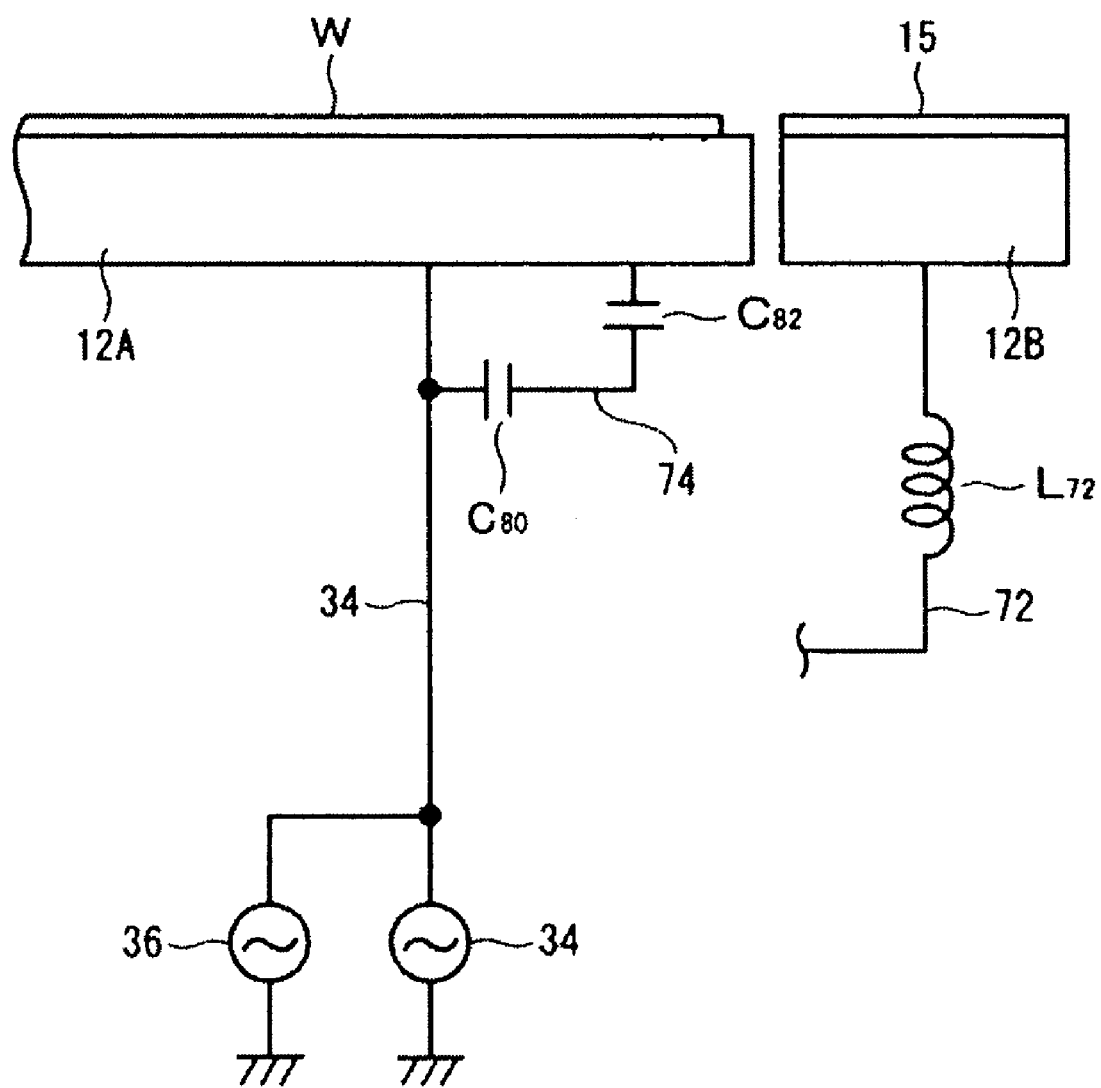
FIG. 5 is a schematic equivalent circuit diagram of the lower electrode dual frequency feed mechanism when the movable feed conductor is switched to the second position (FIG. 4)

FIG. 5 is a schematic equivalent circuit diagram of the lower electrode dual frequency feed mechanism 70 when the movable power feed conductor 74 is switched to the second position (FIG. 4).

In this case, while the capacitor C80 is formed with the central power feed rod 32, the central cylindrical portion 74a of the movable feed conductor 74, and the dielectric material film 80 interposed therebetween, a capacitor C82 is formed with the central radial portion 74b of the movable feed conductor 74, the bottom side of the susceptor center electrode 12A, and the dielectric material film 82 interposed therebetween.

However, the first RF power transmitted from the first RF power supply 34 via the central power feed rod 32 is supplied only to the susceptor center electrode 12A independent of whether or not the power passes through the capacitors C80 and C82. The first RF power is not distributed to the susceptor peripheral electrode 12B. Further, the second RF power is supplied from the second RF power supply 36 to the susceptor center electrode 12A via the central power feed rod 32. That is, the mechanism enters a mode (second mode) where only the susceptor center electrode 12A acts as a RF electrode and the susceptor peripheral electrode 12B has no function.

Operations of respective components of the plasma etching apparatus, e.g., the gas exhaust unit 26, the first and second RF power supplies 34 and 36, the switch 42, the process gas supplying unit 64 and the like, and the entire operation (sequence) of the apparatus are controlled by a controller (not shown), e.g., a microcomputer.

In the plasma etching apparatus, in order to perform an etching process, the gate valve 28 is first opened, and then the semiconductor wafer W to be processed is loaded into the chamber 10 to be mounted on the electrostatic chuck 38. Then, an etching gas (generally a mixture gas) is introduced from the process gas supplying unit 64 into the airtightly sealed chamber 10 at a predetermined amount and flow rate ratio, and the pressure in the chamber 10 is set to a predetermined level by the gas exhaust unit 26. In addition, the first and second RF power supplies 34 and 36 are turned on to output the first RF power (60 MHz) and the second RF power (2 MHz), respectively, to the susceptor 12 (12A and 12B) via the matching unit 30 and the power feed rod 32. Moreover, the switch 42 is turned on and a heat transfer gas (He gas) is confined in a contact interface between the electrostatic chuck 38 and the rear surface of the semiconductor wafer W by an electrostatic absorption force. The etching gas discharged from the gas discharge holes 62 of the upper electrode (shower head) 54 is converted into a plasma by RF discharge in a space formed between both electrodes 12 and 54, and the main surface of the semiconductor wafer W is etched into a predetermined pattern by radicals and ions generated by the plasma.

In the capacitively-coupled plasma etching apparatus, by applying the first RF power having a relatively high frequency of 60 MHz for plasma generation to the susceptor 12, it is possible to make the density of the plasma high in a desirable dissociated state and form high density plasma under a lower pressure condition. In particular, when the lower electrode dual frequency feed mechanism 70 is switched to the first mode shown in FIG. 2, the first RF power from the first RF power supply 34 is emitted from the susceptor center electrode 12A and the susceptor peripheral electrode 12B into the process space PS. Therefore, the etching gas is converted into a plasma at a position right above the space, and it is possible to arbitrarily control a distribution characteristic of plasma density on the semiconductor wafer W in a radial direction by controlling a power distribution ratio of the first RF power between both electrodes 12A and 12B.

Further, by switching the lower electrode dual frequency feed mechanism 70 to the second mode shown in FIG. 4, the susceptor 12 becomes an electrode structure having only the susceptor center electrode 12A, i.e., a single electrode structure and can be restored to a (standard) susceptor similar to the conventional general susceptors. Since hardware compatibility with conventional apparatuses can be obtained in the second mode, it is possible to perform an etching process as in the conventional apparatus.

Figure 6:
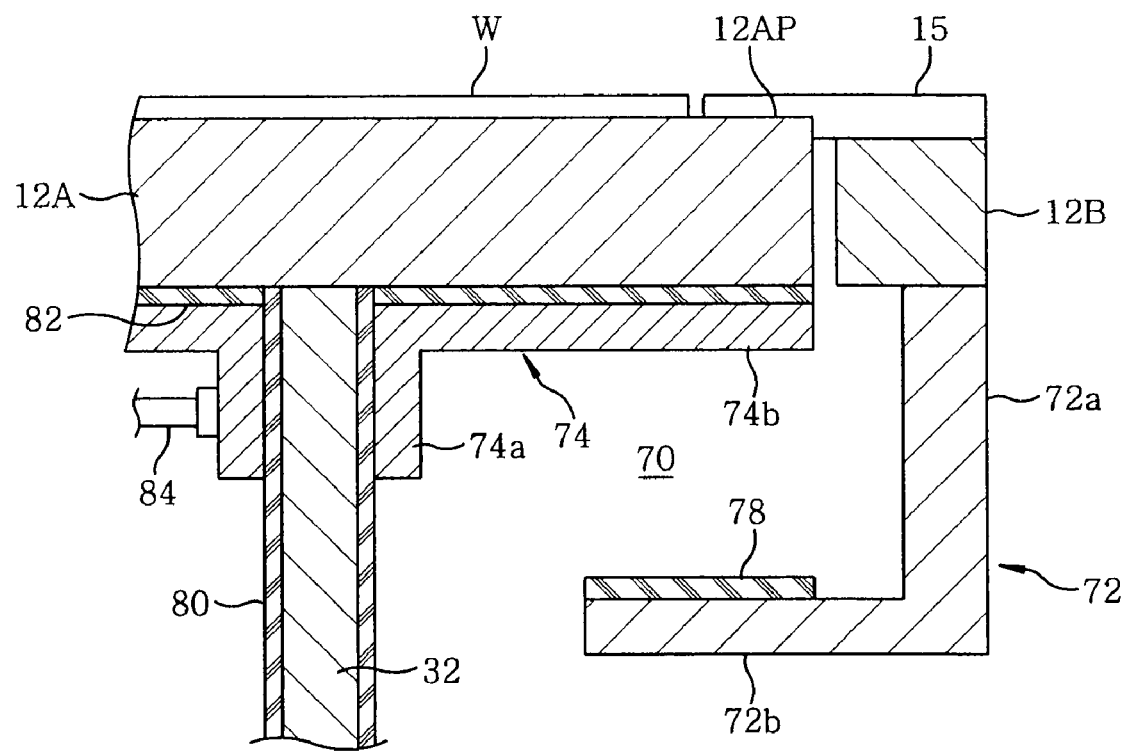
FIG. 6 is a partially-enlarged sectional view showing a modification of a configuration related to a susceptor and a focus ring in accordance with the embodiment.

In order to approach the apparatus structure in the second mode of the present embodiment to a standard hardware without any limitation, a size relation (diameter ratio) between the susceptor center electrode 12A and the semiconductor wafer W may be set as in a conventional general susceptor structure. In other words, as shown in FIG. 6, a susceptor structure may be employed in which a peripheral portion 12AP of the susceptor center electrode 12A projects (for example, by several cm) out of the semiconductor wafer and the focus ring 15 is also mounted on the projecting peripheral portion 12AP. Further, a structure may be employed in which the focus ring 15 is mounted on only the peripheral portion 12AP. However, contrary to a standard form, a susceptor structure is also possible in which an edge of the semiconductor wafer W is loaded on the susceptor peripheral electrode 12B beyond the susceptor center electrode 12A.

In addition, it is also possible to use means other than the peripheral electrostatic chuck 46, e.g., an adhesive, in order to fix the focus ring 15 on the susceptor peripheral electrode 12B or the susceptor center electrode 12A.

In the lower electrode dual frequency feed mechanism 70 of the above-described embodiment, in order to electrically connect the central power feed rod 32 and the lower peripheral power feed conductor 72 by capacitance coupling, the movable power feed conductor 74 is moved vertically downward by the actuator 76 of elevation driving type and the central radial portion 74b of the movable power feed conductor 74 overlaps the circumferential radial portion 72b of the lower peripheral power feed conductor 72 via the dielectric material film 78 (FIG. 2). In this case, the capacitance of the coupling capacitor C78 is defined by a facing electrode area of radial portions 74b and 72b and a film thickness and dielectric constant of the dielectric material film 78, and therefore, a burden of precisely positioning the movable power feed conductor 74 is alleviated.

However, it is also possible to obtain a capacitance coupling of a space gap formed between the central radial portion 74b of the movable power feed conductor 74 and the circumferential radial portion 72b of the lower peripheral power feed conductor 72 without the dielectric material film 78. In this case, it is possible to control and vary impedance of the capacitance coupling by varying a gap size.

Alternatively, if the movable power feed conductor 74 is rotatably movable by changing a position of a rotation direction of the conductor 74 with the central power feed rod 32 as a rotation center, it is possible to control and vary the impedance of the capacitance coupling that electrically interconnects the central power feed rod 32 and the lower peripheral power feed conductor 72.

Figure 7:
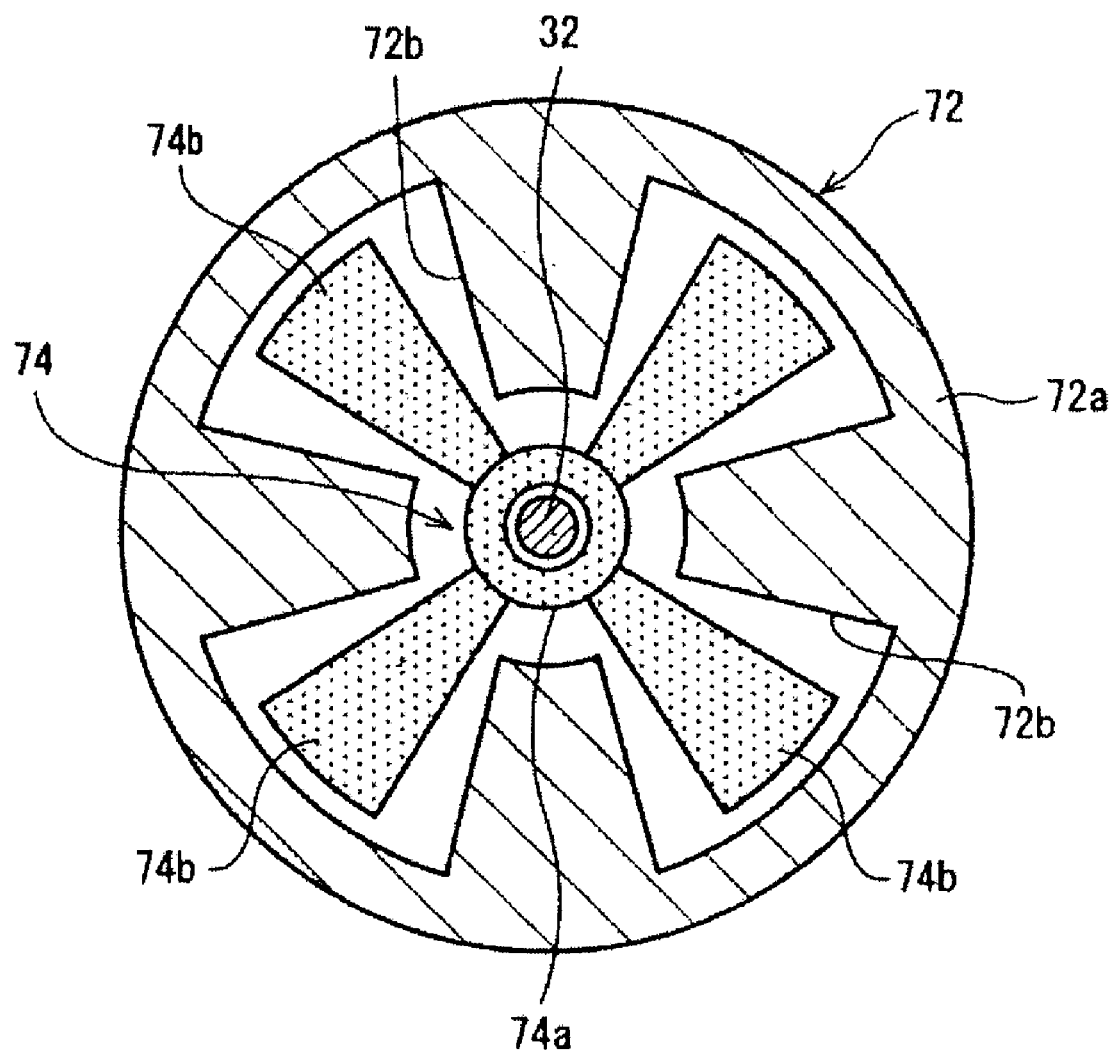
FIG. 7 is a plane view showing a state when the movable feed conductor is switched to a position for a second mode in an exemplary modification of the lower electrode dual frequency feed mechanism.
Figure 8:
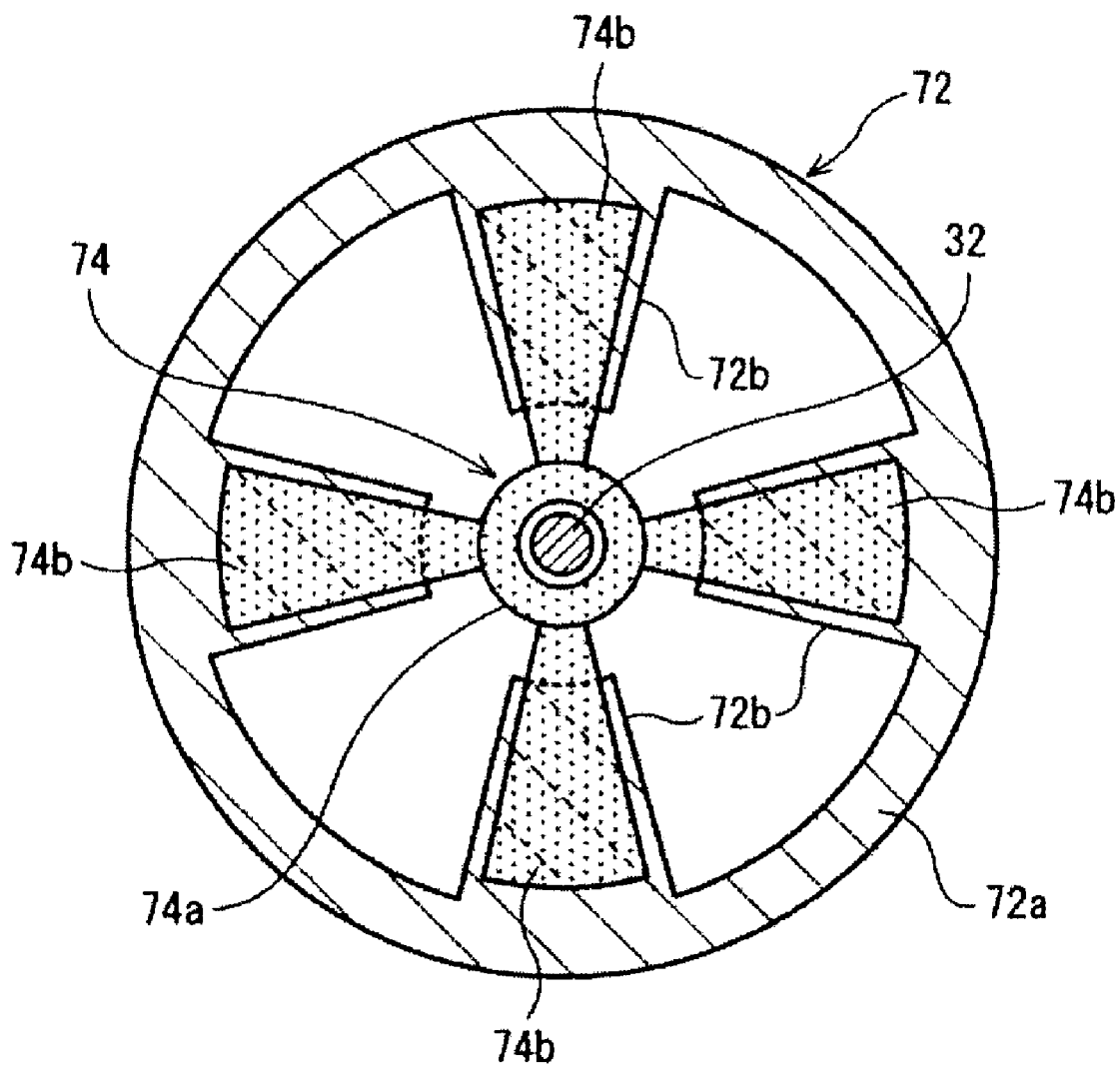
FIG. 8 is a plane view showing a state when the movable feed conductor is switched to a position for a first mode in an exemplary modification of the lower electrode dual frequency feed mechanism.

For example, a plurality (same number) of cut-out portions is formed in the central radial portion 74b of the movable power feed conductor 74 as well as in the circumferential radial portion 72b of the lower peripheral power feed conductor 72 at constant intervals in a circumferential direction, and a position for a second mode can be formed in such a way that fan-shaped central radial portions 74b of the movable power feed conductor 74 face the respective fan-shaped cut-out portions of the lower peripheral power feed conductor 72, as shown in FIG. 7. In this case, it is possible to switch the position of the movable power feed conductor 74 in the rotational direction between the position for the second mode and a position (position for the first mode) at which the fan-shaped central radial portions 74b of the movable power feed conductor 74 face the respective fan-shaped circumferential radial portions 72b of the lower peripheral power feed conductor 72, as shown in FIG. 8. In the first mode, the capacitance or impedance of the capacitance coupling can be varied and adjusted by varying and adjusting the position of the movable power feed conductor 74. Further, when the movable power feed conductor 74 is rotatably movable, the actuator 76 may be also changed to a rotation driving type.

Although the embodiment of the present invention has been illustrated in the above, the present invention is not limited to the above embodiment but may be modified in various ways. Particularly, the configuration of the lower electrode dual frequency feed mechanism 70 may be selected and modified in various ways to provide optimal combination with other mechanisms of the apparatus.

Moreover, the present invention is not limited to the above lower part two-frequency application system as in the above embodiment but may be, e.g., suitable to be applied to a lower electrode single frequency application system to apply single RF power for RF discharge to the susceptor (lower electrode) and moreover may be applied to the upper electrode used a RF electrode.

The present invention is not limited to the above plasma etching apparatus but may be applied to other plasma processing apparatuses such as plasma CVD, plasma oxidation, plasma nitration, sputtering apparatuses and the like. In addition, the subject substrate used in the present invention is not limited to the semiconductor wafer but may be any of various substrates for flat panel display, a photomask, a CD substrate, a printed circuit board or the like.

In accordance with the plasma processing apparatus of the present invention with the above-described configuration and operation, it is possible to easily and arbitrarily control a plasma density distribution in a capacitance coupling type and improve uniformity and yield of a plasma process.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a vacuum-evacuable processing chamber;
a lower center electrode mounting there on a substrate to be processed in the processing chamber;
an annular lower peripheral electrode electrically isolated from the lower center electrode and surrounding the circumference of the lower center electrode;
an upper electrode disposed above the lower center electrode and the lower peripheral electrode to be faced therewith;
a process gas supplying unit for supplying a processing gas to a process space formed between the lower center electrode, the lower peripheral electrode and the upper electrode;
a first radio frequency (RF) power supply for outputting a first RF power to mainly generate a plasma of the processing gas;
a second radio frequency (RF) power supply for outputting a second RF power to mainly introduce ions in the plasma into the substrate;
a central feed conductor connected to a rear surface of the lower center electrode to supply the first RF power from the first RF power supply and the second RF power from the second RF power supply to the lower center electrode;
a circumferential feed conductor connected to a rear surface of the lower peripheral electrode to bypass and supply some of the first RF power from the first RF power supply to the lower peripheral electrode; and
a movable feed conductor which is movable within a specific range and electrically connects the central feed conductor and the circumferential feed conductor with respect to the first RF power supplied from the first RF power supply by capacitance coupling.

2. The plasma processing apparatus of claim 1, wherein impedance of the capacitance coupling between the central feed conductor and the circumferential feed conductor is variably controlled depending on a position of the movable feed conductor.

3. The plasma processing apparatus of claim 1, wherein the movable feed conductor is movable up to a position at which the central feed conductor is electrically isolated from the circumferential feed conductor.

4. The plasma processing apparatus of claim 1, wherein the central feed conductor has a cylindrical or columnar shape, and the movable feed conductor includes an annular central cylindrical portion surrounding the circumference of the central feed conductor, and a central radial portion extending outwardly radially from the central cylindrical portion to a position at which the central radial portion is electrically connected to the circumferential feed conductor by capacitance coupling.

5. The plasma processing apparatus of claim 1, wherein the circumferential feed conductor includes a circumferential cylindrical portion extending downward from the lower peripheral electrode, and a circumferential radial portion extending inwardly radially from the circumferential cylindrical portion to a position at which the circumferential radial portion is electrically connected to the movable feed conductor by capacitance coupling.

6. The plasma processing apparatus of claim 4, wherein the movable feed conductor is movable in an axial direction along the central feed conductor.

7. The plasma processing apparatus of claim 5, wherein the movable feed conductor is movable in an axial direction along the central feed conductor.

8. The plasma processing apparatus of claim 4, wherein the movable feed conductor is rotatable around the central feed conductor as a rotation center axis.

9. The plasma processing apparatus of claim 5, wherein the movable feed conductor is rotatable around the central feed conductor as a rotation center axis.

10. The plasma processing apparatus of claim 4, wherein a gap of a specific size is formed between an outer circumferential surface of the central feed conductor and an inner circumferential surface of the central cylindrical portion of the movable feed conductor.

11. The plasma processing apparatus of claim 10, further comprising a dielectric substantially filling the gap.

12. The plasma processing apparatus of claim 1, wherein a focus ring is disposed on the lower peripheral electrode.

13. The plasma processing apparatus of claim 1, wherein a focus ring is mounted on the lower center electrode and the lower peripheral electrode.

14. A plasma processing apparatus for generating a plasma of a processing gas by radio frequency (RF) discharge in a vacuum-evacuable processing chamber, and subjecting a substrate disposed at a predetermined position in the processing vessel to a desired plasma process under the plasma, comprising:

a center electrode and a circumferential electrode formed by radially dividing an RF electrode to which an RF power for discharge is applied from an RF power supply;

a central feed conductor and a circumferential conductor connected to rear surfaces of the center electrode and the circumferential electrode, respectively, in order to distribute the RF power applied from the RF power supply to the center electrode and the circumferential electrode at a specific ratio; and a movable feed conductor which is movable within a specific range and electrically connects the central feed conductor and the circumferential feed conductor with respect to the RF power from the RF power supply by capacitance coupling.

\* \* \* \* \*